United States Patent [19]

Nakamura et al.

[11] Patent Number: 4,777,369

[45] Date of Patent: Oct. 11, 1988

[54] ELECTRON BEAM LITHOGRAPHIC METHOD

[75] Inventors: Kazumitsu Nakamura; Hiroyuki Ito, both of Katsuta, Japan

[73] Assignee: Hitachi, Ltd., Tokyo, Japan

[21] Appl. No.: 900,423

[22] Filed: Aug. 26, 1986

[30] Foreign Application Priority Data

Aug. 30, 1985 [JP] Japan ............................ 60-191630

[51] Int. Cl.⁴ .................... G01K 1/08; H01J 3/14
[52] U.S. Cl. .................. 250/398; 250/452.2
[58] Field of Search ............. 250/492.21, 492.22, 250/492.23, 492.2, 398

[56] References Cited

U.S. PATENT DOCUMENTS

| | | | |
|---|---|---|---|
| 3,949,228 | 4/1976 | Ryan | 250/398 |
| 4,112,305 | 9/1978 | Goto et al. | 250/398 |
| 4,423,305 | 12/1983 | Pfeiffer | 250/492.23 |
| 4,445,041 | 4/1984 | Kelly et al. | 250/398 |
| 4,550,258 | 10/1985 | Omata et al. | 250/492.23 |

OTHER PUBLICATIONS

"Variable Spot Shaping for Electron-Beam Lithography", Pfeiffer, *J. Vac. Sci. Tech.*, vol. 15, No. 3, May 1978, pp. 887-890, 250-492.23.

Primary Examiner—Bruce C. Anderson
Attorney, Agent, or Firm—Antonelli, Terry & Wands

[57] ABSTRACT

An electron beam lithographic method for describing a fine pattern on the surface of a semiconductor specimen by irradiating the surface of the specimen with an electron beam.

The electron beam generated by an electron gun is converged onto a specimen through electron lenses. When a step of lithography has been finished, the electron beam is blanked by a shaping deflector that shapes the electron beam and that is disposed between a first shaping iris and a second shaping iris, so that the specimen is not damaged by the reflected electron beam or by the scattered electrons.

5 Claims, 1 Drawing Sheet

ELECTRON BEAM LITHOGRAPHIC METHOD

BACKGROUND OF THE INVENTION

The present invention relates to an electron beam lithographic apparatus which describes a fine pattern on the surface of a semiconductor specimen by irradiating the surface of the specimen with an electron beam.

To meet the demand toward high-speed processing in recent years, technical development has been pushed forward in the field of electron beam lithographic apparatus to increase the electric current of beam and to increase the resist sensitivity in addition to adapting a variable shape beam system. As the resist becomes highly sensitive and the beam current increases, however, there arise problems in that the specimen is damaged to develop fog due to electrons that are reflected and scattered by the surface of the specimen and by the inner walls of the apparatus, and that the electron beam impinges upon the residual gases in the apparatus whereby the residual gases are polymerized and are deposited in the apparatus giving rise to the occurrence of contamination.

The inventors have forwarded the study in regard to damage caused by the specimen by the conventional electron beam lithographic apparatus based upon the variable beam system that is shown in FIG. 2 and contamination in the apparatus.

In FIG. 2, a first shaping iris 12 and a second shaping iris 14 are arranged under (in front of) an electron gun 10, and a shaping deflector 16 is disposed between the first shaping iris 12 and the second shaping iris 14. A blanking electrode 18 is provided under the second shaping iris 14 to bend a main beam 24 that has passed through an opening 20 of the first shaping iris 12 and an opening 22 of the second shaping iris 14. An objective iris 26 provided under the blanking electrode 18 has an opening 30 that guides the main beam 24 onto a specimen 28. A beam deflector 32 is provided under the objective iris 26 to scan the main beam 24. In FIG. 2, reference numeral 34 denotes a leakage beam, and 36 denotes a fog exposure on the surface of the specimen caused by the leakage beam 34.

According to the thus constructed electron beam lithographic apparatus of the variable shape beam system, the main beam 24 which has passed through the first shaping iris 12 is adjusted by the shaping deflector 16. That is, the shaping deflector 16 projects a projected image of the opening 20 of the first shaping iris 12 onto the opening 22 of the second shaping iris 14, to form a conjugate beam of the opening 20 and of the opening 22. The main beam 24 which is the conjugate beam passes through an opening 30 of the objective iris 26, converged by electron lenses 1, 2, 3 and 4, and reaches a specimen 28. The beam deflector 32 is served with a voltage controlled by a controller that is not shown in FIG. 2, whereby the main beam 24 scans along the surface of the specimen 28 to describe a fine image on the surface of the specimen 28.

Thus, as a line or an image is described on the specimen, the voltage applied to the blanking electrode 18 is changed, whereby the main beam 24 is deflected as shown in FIG. 2 and is cut by the objective iris 26. Then, new lithographic data are transferred to the controller, the voltage applied to the beam deflector 32 is controlled, the voltage applied to the blanking electrode 18 is returned to the initial value, and the next lithographic step is initiated.

As the main beam 24 passes through the first shaping iris 12, the second shaping iris 14 and the objective iris 26, however, the main beam is partly reflected and scattered by the edges of the openings 20, 22 and 30, resulting in the formation of a leakage beam 34. The leakage beam 34 is also converged on the surface of the specimen 28 owing to the optical image-forming conditions that are essentially the same as those for the main beam 24. Moreover, since the electrons that are reflected and scattered at the edges of the openings are not uniform in regard to their scattering conditions, angle of emission and kinetic energy at the edges, the leakage beam 34 partly falls on the specimen 28 to form fog, despite the main beam 24 is cut by the blanking electrode 18 as shown in FIG. 2. In this case, the major portion of the leakage beam 34 consists of electrons that are scattered at the edge of the opening 22 of the second shaping iris 14.

Fog exposure 36 due to the leakage beam 34 becomes conspicuous due to deposition of insulating material (contaminating substance) that stems from the residual gases when the electron beam is irradiated for an extended period of time, due to the electric field established by the accumulation of electric charges at the openings of the irises, due to the divergent angle of the main beam 24, and due to the dispersion of energy. Even if the leakage beam 34 may be about 1 ppm ($1/10^6$) of the main beam 24 and the resist exposure by the main beam may be about 1 $\mu$s, the resist is exposed if the specimen 28 is irradiated with the leakage beam 34 for one second. Therefore, if the lithographic data are transferred for extended periods of time, the specimen 28 is damaged due to fog exposure 36 caused by the leakage beam 34.

To cope with such a problem, it can be contrived to increase the amount of deflection at the time of blanking to decrease the amount of the leakage beam 34, i.e., to increase the voltage that is applied to the blanking electrode 18. With the blanking voltage being boosted, however, extended periods of time are required for the applied voltage to rise or break down, deteriorating the response characteristics.

SUMMARY OF THE INVENTION

The object of the present invention is to provide an electron beam lithographic method which prevents the specimen from being damaged by the electrons that are reflected and scattered at the openings of the shaping irises, and which further prevents the interior of the apparatus from being contaminated.

According to the present invention, the electron beam is deflected by a shaping deflector that is disposed between the first shaping iris and the second shaping iris in synchronism with the blanking action of the blanking electrode, and the electron beam is guided through the opening of the second shaping iris to greatly reduce the electrons that are reflected and scattered at the opening of the second shaping iris, so that the specimen is damaged little.

DESCRIPTION OF THE PREFERRED EMBODIMENT

Figure 1:
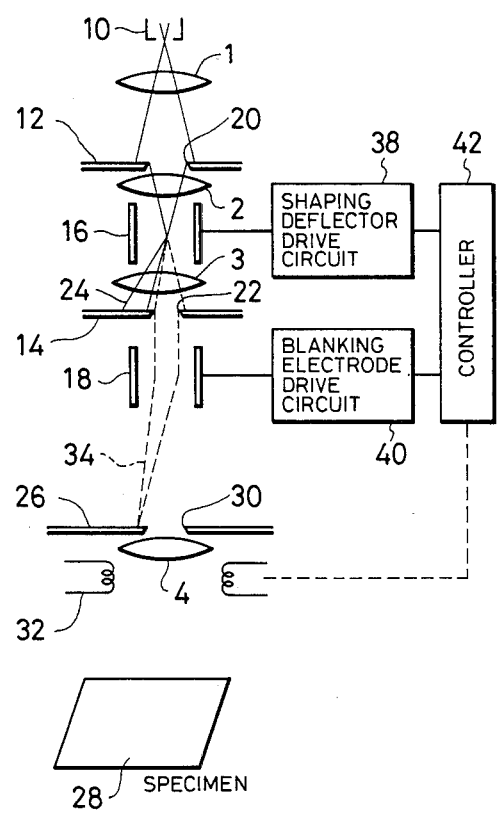
FIG. 1 is a diagram which schematically illustrates the structure of an electron beam lithographic apparatus according to an embodiment of the present invention.

An electron beam lithographic apparatus according to a preferred embodiment of the present invention will be described below in detail in conjunction with FIG. 1. The portions corresponding to those of the conventional example of FIG. 2 are denoted by the same reference numerals and are not described.

Figure 2:
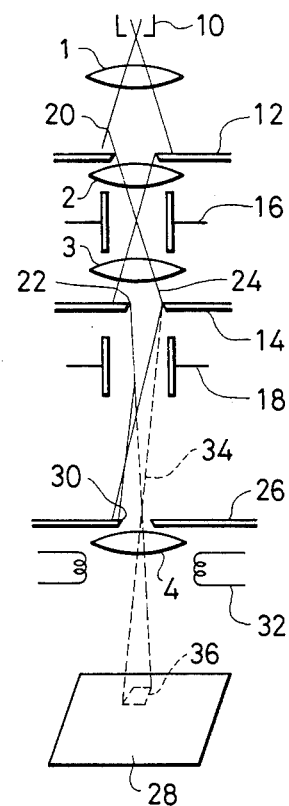
FIG. 2 is a diagram which schematically illustrates the structure of an optical system in a conventional electron beam lithographic apparatus.

In FIG. 1, the shaping deflector 16 is connected to a shaping deflector drive circuit 38, and the blanking electrode 18 is connected to a blanking electrode drive circuit 40. Like the beam deflector 32, the shaping deflector drive circuit 38 and the blanking electrode drive circuit 40 are connected to a controller 42.

In the embodiment thus constructed, the lithography on the specimen 28 by the main beam 24 is performed in the same manner as the above-mentioned conventional art. Usually, the lithographic cycle is performed with a beam deflecting region (field) as a unit, and the lithographic data are also transferred with the fields as a unit. The main beam 24 is cut and is placed off the surface of the specimen when the stage carrying the specimen 28 is moved prior to starting the lithography, when the distance is measured (Z measurement) between the specimen 28 and the objective iris 30, when the analog circuit is being set, or when the next lithographic data are being transferred after one field has been drawn. The blanking operation for placing the main beam 24 out of the specimen is performed as described below after a field has been drawn.

After a field has been described, the controller 42 feeds a blanking-on signal to a blanking electrode drive circuit 40 to apply a predetermined blanking voltage to the blanking electrode 18, and further feeds a lithography end signal to the shaping deflector drive circuit 38. Upon receipt of the lithography end signal, the shaping deflector drive circuit 38 applies a predetermined beam cut voltage to the shaping deflector 16 to guide the main beam 24 that has passed through the first shaping iris 12 to pass through the opening 22 of the second shaping iris 14, so that the main beam 24 is cut by the second shaping iris 14. With the main beam 24 being cut by the second shaping iris 14, then the major portion of the leakage beam 34 is composed of electrons that are reflected and scattered at the opening 20 of the first shaping iris 12. Therefore, the leakage beam 34 generated at the opening 20 of the first shaping iris 12 passes through the second shaping iris 14, deflected outside the opening 30 of the object iris 26 owing to the action of the blanking electrode 18, and does not reach the specimen 28. Therefore, if the relative intensity of the leakage beam 34 to the main beam 24 according to the conventional art is $I_{BLK}$, the relative intensity according to this embodiment is of the order of $I_{BLK}^2$. That is, the conventional order of $10^{-6}$ can be reduced to the order of $10^{-12}$, and the beam can be cut almost completely. Moreover, since the leakage beam 34 is composed of electrons that are diffused twice, by the first shaping iris 12 and the second shaping iris 14, the energy is so dispersed that it converges little on the surface of the specimen, and the phenomenon of fog can be greatly reduced.

According to this embodiments as described above, a two-stage blanking mechanism consisting substantially of the shaping deflector 16 and the blanking electrode 18, helps to prevent the electrons from being scattered by the edge of opening 20 of the second shaping iris 14, that is the very cause of fog phenomenon in the conventional art. Namely, the beam can be cut sufficiently by the blanking mechanism having a relatively small angle of deflection. Moreover, wall surfaces under the second shaping iris 14 and, particularly, the objective iris 16 are irradiated with the beam in reduced amounts. Further, since the electric charges are accumulated little in the objective iris 26, the beam drift is reduced, astigmatism is reduced, contamination is prevented, and the apparatus exhibits an improved reliability.

Though the above embodiment has dealt with the case where the blanking electrode 18 is provided under the second shaping iris 14, the invention can also be adapted to the case where the blanking electrode 18 is provided above the first shaping iris 12. It is further allowable to provide the shaping deflector drive circuit 38 with a timer function; i.e., the shaping deflector drive circuit 38 can be automatically operated in case the lithography is interrupted due to the trouble and the beam blanking is continued for an extended period of time by the blanking electrode 18. In the aforementioned embodiment, furthermore, the lithography end signal is applied to the shaping deflector drive circuit 38 to operate it. Instead of the lithography end signal, however, it is also allowable to add, in the form of lithographic data, the data on a shaping beam size which can cut the main beam 24, to the end of the block of the lithographic data in order to cut the beam.

We claim:

1. An electron beam lithographic method utilizing:
   an electron gun for generating an electron beam;
   a first shaping iris which is disposed in front of said electron gun, and which is provided with an opening to permit the passage of said electron beam;
   a second shaping iris provided with an opening to permit the passage of said electron beam that has passed through said first shaping iris toward a specimen;
   a shaping deflector which is disposed between said first shaping iris and said second shaping iris, and which controls the travelling direction of said electron beam that has passed through said first shaping iris;
   a shaping deflector drive circuit for driving said shaping deflector;
   a blanking electrode which guides said electron beam falling on said specimen to be deflected outside said specimen when one step of lithography has been finished; and
   a blanking electrode drive circuit for driving the blanking electrode;
   wherein the method includes the steps of effecting lithography and when said step of lithography has been finished, controlling said blanking electrode drive circuit and, at the same time, controlling said shaping deflector drive circuit to drive said shaping deflector, so as to guide said electron beam that has passed through said first shaping iris to fall outside the opening of said second shaping iris.

2. An electron beam lithographic method according to claim 1, further comprising an objective iris provided with an opening to guide said electron beam that is passed through said second shaping iris onto said specimen, said blanking electrode being disposed for deflecting said electron beam that has passed through said second shaping iris.

3. An electron beam lithographic method comprising the steps of:

generating an electron beam from an electron gun to converge on a specimen through an electron lens system;

passing the electron beam from the electron gun through a first shaping iris equipped with an opening;

passing the electron beam that is passed through the first shaping iris toward the specimen through a second shaping iris equipped with an opening;

impinging the electron beam on the specimen during lithography by a blanking deflector means and utilizing the blanking deflector means to deflect the electron beam outside of the specimen when the lithography is finished; and controlling the travelling direction of the electron beam that is passed through the first shaping iris by a shaping deflector means disposed between the first shaping iris and the second shaping iris so as to shape the electron beam during the lithography, and controlling the shaping deflector means to deflect and block the electron beam that is passed through the first shaping iris from passing through the second shaping iris when the lithography is finished.

4. An electron beam lithographic method according to claim 3, further comprising the step of deflecting a leakage electron beam outside of the specimen by the blanking deflector means so that the leakage electron beam passing through the second shaping iris does not impinge on the specimen when the shaping deflector means deflects the electron beam that is passed through the first shaping iris so as to block the electron beam from passing through the second shaping iris.

5. An electron beam lithographic method according to claim 3, further comprising the step of guiding the electron beam that is passed through the second shaping iris onto the specimen via an opening provided in an objective iris, the blanking deflector means being disposed between the objective iris and the second shaping iris for deflecting the electron beam that is passed through the second shaping iris outside of the opening of the objective iris when the lithography is finished.

* * * * *